United States Patent [19]
Basi

[11] 3,775,201
[45] Nov. 27, 1973

[54] METHOD FOR POLISHING SEMICONDUCTOR GALLIUM PHOSPHIDE PLANAR SURFACES

[75] Inventor: Jagtar Singh Basi, Wappingers Falls, N.Y.

[73] Assignee: International Business Machines Corporation, Armonk, N.Y.

[22] Filed: Oct. 26, 1971

[21] Appl. No.: 192,546

[52] U.S. Cl. .......... 156/17, 156/2
[51] Int. Cl. .......... H01l 7/50
[58] Field of Search .......... 156/17, 2, 345

[56] References Cited

UNITED STATES PATENTS

| | | | |
|---|---|---|---|
| 3,262,825 | 7/1966 | Fuller | 156/17 |
| 3,629,023 | 12/1971 | Strehlow | 156/17 |

OTHER PUBLICATIONS

Anodic Dissolution and Selective Etchg. of GaP, Aug. 1971, p. 2226, Meek et al., Bell Tel. Lab. Abstract 185 J. of Elec. Chem. Soc. Vol. 118, No. 8.

*Primary Examiner*—Jacob H. Steinberg
*Attorney*—Daniel E. Igo et al.

[57] ABSTRACT

An improved method for polishing gallium phosphide planar surfaces is disclosed comprising positioning gallium phosphide wafers or slices in close adjacency to a polishing medium providing a relative motion between said wafer and polishing medium while providing a controlled predetermined flow of OBr⁻ ions to said wafers and polishing medium and continuing the relative motion until the wafer surface is polished to a smooth and featureless condition whereupon the wafers are washed and removed from the polishing mechanism.

8 Claims, 3 Drawing Figures

INVENTOR
JAGTAR S. BASI

BY

ATTORNEY

METHOD FOR POLISHING SEMICONDUCTOR GALLIUM PHOSPHIDE PLANAR SURFACES

BACKGROUND OF THE INVENTION

1. Field of the Invention

This invention relates to a method for polishing semiconductor planar substrates to a high degree of surface perfection and more particularly to a method for polishing gallium phosphide wafers or slices under predetermined conditions whereby a greatly improved polishing rate is obtained and surface conditions are of an improved high degree of perfection.

2. Description of the Prior Art

Semiconductor devices such as integrated monolithic circuits, diodes, passive devices, and the like, are formed by various additive techniques, such as diffusion and epitaxial growth in the planar surfaces of semiconductor materials. Gallium phosphide is a well known material utilized for the manufacture of such devices. The perfection of the gallium phosphide planar surface in regard to featureless or surface fine-structure conditions down to an order of Angstrom units, surplus planarity, uniformity and freedom of mechanical damage and flatness is a fundamental requirement for the manufacture of semiconductor devices. It is advantageous and desirable to have gallium phosphide wafers or slices having highly polished surfaces prior to the performance of processing steps where effectiveness may be descreased by the presence of undesirable surface conditions and contaminants. Such processing steps might include, for example, the formation of epitaxial layers on the slice, the controlled diffusion of impurities into the slice or thermal treatment or final encapsulation of the device. The surface planarity of the wafer becomes highly critical in photolithographic masking techniques because of the constant effort to decrease the physical size of the device. Any increase in distance between the mask and the wafer surface caused by significant deviations from the ideally planar wafer unfavorably effects the image resolution of fine device structure on the surface of the wafer. Poor device yields are the result at the periphery of the wafer where a non-planary becomes more pronounced as one proceeds towards the edge or outsde periphery of the wafer for device formation. The surface fine-structure characteristic over the entire wafer is also an extremely important characteristic as it can produce poor devices throughout the wafer. Mechanical or physical defects and irregularities in the planar wafer surface also produce marginal or useless devices throughout the entire surface which also can result in a waste of manufacturing time and excess cost due to low yield.

There are a wide variety of chemical agents known which will dissolve gallium phosphide. Consequently, the agents will etch the material. The majority of these etchants are preferential or selective. This means the surface of a given crystallographic orientation of single crystal gallium phosphide etches at different rates along the different crystallographic planes intersecting this surface. Such etchants are termed selective etchants because of the nature of their etching behavior. Therefore, one cannot employ them to obtain mirror-smooth or featureless planar surfaces without disregard for crystallographic orientation. U. S. Pat. No. 3,342,652 discloses the use of sodium hypochlorite and potassium hypochlorite solutions useful as oxidizing agents in the polishing of gallium arsenide. Although my copending U.S. Pat. application Ser. No. 189,114 filed Oct. 14, 1971 entitled "Method for Polishing Semiconductor Gallium Arsenide Planar Surfaces" discloses a method for polishing gallium arsenide using a hypochlorite solution and a base, the process is inoperative for polishing gallium phosphide.

The chemical etchants suitable for producing polished surfaces on semiconductor materials such as silicon and germanium are not very effective in polishing the III–V compound semiconductors. Mixtures of hydrogen fluoride and nitric acid in various proportions and concentrations can be used to some extent. However, poor surface conditions generally result when gallium phosphide surfaces are being polished with nitric acid even at the smoother etching <100> face. The use of bromine in methyl alcohol has been suggested as a polishing or etching solution in a wide variety of concentrations. The use of bromine and chlorine with organic solvents requires considerable caution since violent reactions may occur. Similarly, hydrogen peroxide in combination with sulphuric acid, sodium hydroxide or ammonium hydroxide may be used as a polishing medium but under limited conditions and at low polishing rates. Aqueous silica gel has some use at low rates but produces imperfect surfaces.

Prior art techniques for the polishing of gallium phosphide wafer surfaces may be evaluated in relation to the rate of material removed over a specified time at maximum load conditions. Gallium phosphide surfaces polished are in a multi-wafer configuration or a single wafer.

SUMMARY OF THE INVENTION

It is an object of this invention to provide a method for polishing gallium phosphide surfaces to a high degree of perfection.

It is a further object of this invention to provide a method for polishing gallium phosphide surfaces at a rate heretofore unknown.

It is a further object of this invention to provide a method or process for obtaining any high quality damage-free planar polishes on all gallium phosphide crystallographic orientations.

It is another object of this invention to provide a method for polishing N-type monocrystalline gallium phosphide.

It is another object of this invention to provide a process which enables polishing of all common gallium phosphide crystallographic orientations independent of conductivity type to produce a highly polished featureless planar surface.

It is still a further object of this invention to provide a chemical method of polishing gallium phosphide wafers or slices which produces a highly planar and excellent featureless surface.

These and other objects are accomplished in accordance with the broad aspects of the present invention by providing a method or process comprising positioning an area of gallium phosphide surfaces in a single or multi-wafer configuration upon a suitable polishing block or wheel adjacent to a polishing medium while maintaining a flow of an $OBr^-$ ionizable solution selected from the group consisting of potassium oxybromide, sodium oxybromide, calcium oxybromide and lithium oxybromide in the presence or absence of a base such as sodium carbonate upon said medium and gallium phosphide surfaces and simultaneously providing a relative motion between said surface and polishing medium for a predetermined time dependent upon said solution concentrations and flow rates of said solution upon the polishing medium and gallium phosphide surface. The foregoing steps are followed by washing and removing the wafer or slices from the polishing mechanism.

The foregoing and other objects, features and advantages of this invention will be apparent from the more particular description of the preferred embodiments of the invention as illustrated in the accompanying drawings.

DESCRIPTION OF PREFERRED EMBODIMENTS

The gallium phosphide polishing method of this invention overcomes the shortcomings and differences of prior polishing techniques utilizing dilute solutions of organo bromine mixtures and hydrogen fluoride-nitric acid combinations. These solutions are essentially etchants for gallium phosphide and produce pitted and damaged surfaces which do not polish to a featureless surface using mechanical polishing techniques.

It is believed that the method of this invention proceeds in accordance with the following chemical reaction:

$$GaP + 4NaOBr \longrightarrow GaPO_4 + 4NaBr$$

The gallium phosphate formed in accordance with the foregoing reaction is capable of being removed by mechanical polishing motion or by dissolving in a base such as sodium carbonate, sodium hydroxide and similar type bases.

Appropriate solution concentrations of sodium oxybromide can be prepared in accordance with the following illustrative reactions:

$$NaOCl + KBr \longrightarrow NaOBr + KCl \quad (1)$$

$$2NaOH + Br_2 \longrightarrow NaOBr + NaBr + H_2O \quad (2)$$

Any standard polishing equipment is appropriate for use in this method. The wafer plate polishing assembly described in U. S. Pat. No. 3,342,652 is an example of polishing apparatus suitable for use in accordance with the method of this invention. Generally, a lapping or rough polishing step is followed, but due primarily to the great increase in polishing rates made possible by this invention, lapping is not necessary to produce bright, featureless gallium phosphide surfaces.

Figure 1:
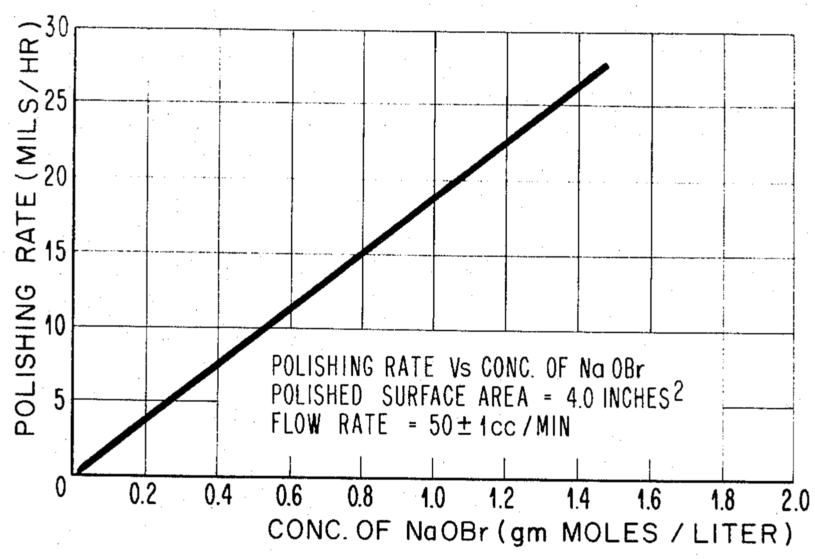
FIG. 1 is a plot of the polishing rate of doped gallium phosphide in mils per hour versus the concentration normality of sodium oxybromide polishing solution at a flow rate of 50 cubic centimeters per minute.
Figure 2:
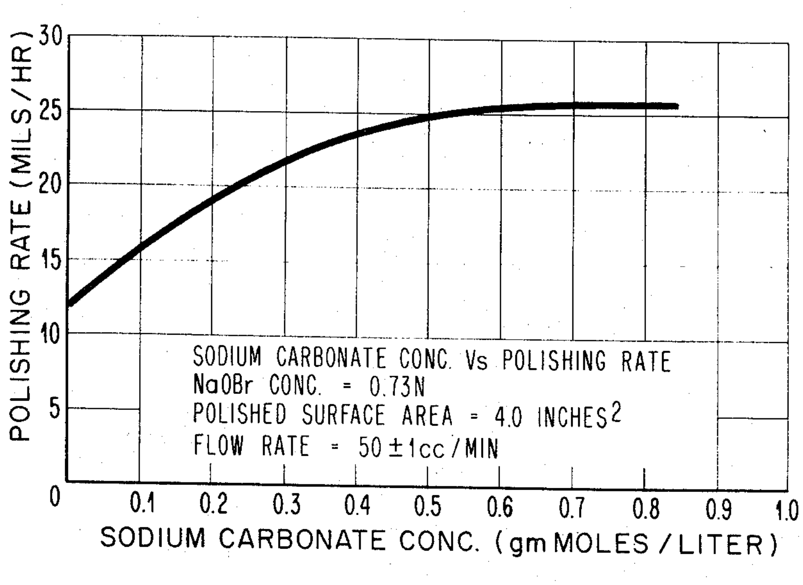
FIG. 2 is a plot of polishing rate versus various concentrations of sodium carbonate while maintaining a sodium oxybromide constant flow rate of approximately 50 cubic centimeters per minute upon the polishing surfaces.
Figure 3:
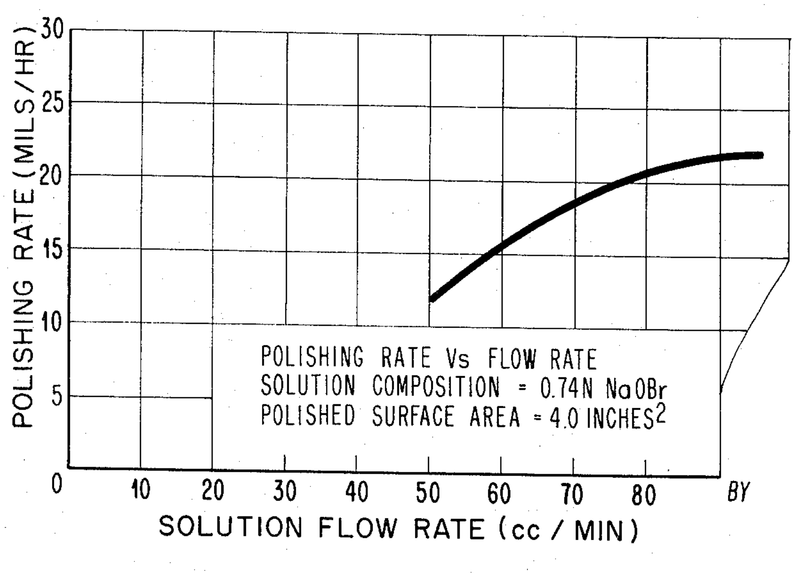
FIG. 3 is a plot of the polishing rate in mils per hour versus the flow of sodium oxybromide on gallium phosphide surface area being polished.

The desired polishing rate is controlled by the concentration and flow rate of the oxybromide polishing solution. If $Na_2Co_3$ is utilized with the oxybromide, the interrelationship between polishing rate and carbonate concentration is illustrated in FIG. 2. FIG. 1 clearly illustrates the critical nature of the concentration of sodium oxybromide polishing solution in relation to the polishing rate. It is apparent that when the concentration of the oxybromide polishing compound is increased, a maximum polishing rate is obtained. Increased concentration of the alkali metal carbonate type base does not affect the polishing rate above approximately 0.5 gram moles per liter. This feature is illustrated further in FIG. 2.

The foresaid aforesaid are consistent with the following chemical reactions:

$$GaP + 4NaOBr \longrightarrow GaPO_4 + 4NaBr$$

$$GaPO_4 + 4Na_2CO_3 + 4H_2O \longrightarrow NaGa(OH)_4 + 4NaHCO_3 + Na_3PO_4$$

adding the above equations $$GaP + 4NaOBr + 4Na_2CO_3 + 4H_2O \longrightarrow 4Na[GaOH_4] + 4NaBr + 4NaHCO_3 + Na_3PO_4$$

The following specific example is further illustrative of a specific embodiment of the invention.

Five single crystal gallium phosphide wafers having <100> crystallographic orientation and N-type doped were polished in accordance with this invention using a polishing mechanism as described in the aforesaid patent. The total wafer area was 4.0 sq. in. The wafers were mounted upon a polishing wheel, rotated said wheel at 60rpm in accordance with well known standard procedures, and washed with water at the rate of approximately 200cc per minute for three minutes followed by a constant flow of 50cc per minute of polishing solution (0.18N sodium oxybromide). The gallium phosphide wafers were then again water washed on the rotating polishing wheel for three minutes at the rate of approximately 200cc per minute. No external pressure was exerted upon the polishing plate. The time of polishing depends upon the rate of material removal as illustrated in FIG. 1, and in this instance was 30 minutes. The aforesaid procedure produced a bright, shining featureless gallium phosphide surface without any film or other surface contamination. Although the above specific example illustrates polishing <100> crystallographic orientation, all orientations are capable of being polished in accordance with this invention. Between 0.1 and 0.2 normal oxybromide concentration, the surface produced in accordance with this invention, in addition to being featureless, it is bright.

It has been observed that the more concentrated polishing of oxybromide tends to produce a featureless and dulled surface on the wafer or wafers which can be brightened, if desired, by using a dilute (0.1–0.2 normal) of oxybromide solution for a short polishing period, e.g. for about 3 to 5 minutes, or using oxybromide with a base of comparable normality. Although washing with water is illustrated, any suitable washing compound which does not react with alkali metal oxychloride is anticipated.

The following table sets forth various examples of solution composition at varying flow rates per minute and shows the polishing rate for four sq. in. of N-type gallium phosphide surfaces being polished to a featureless condition:

| No. | Solution flow rate (cc./min.) | Solution composition (gm. moles/lit.) NaOBr | $Na_2CO_3$ | Polished surface area (in.²) | Polishing rate (mils/hr.) |
|---|---|---|---|---|---|
| 1 | 50 | 1.42 | 0 | 4 | 2.7 |
| 2 | 50 | 0.73 | 0 | 4 | 11.9 |
| 3 | 50 | 0.365 | 0 | 4 | 7.5 |
| 4 | 50 | 0.1825 | 0 | 4 | 5.2 |
| 5 | 73 | 0.73 | 0 | 4 | 19.8 |
| 6 | 96 | 0.73 | 0 | 4 | 22.4 |
| 7 | 50 | 0.74 | 0 | 4 | 11.9 |
| 8 | 50 | 0.74 | 0.2 | 4 | 19.0 |
| 9 | 50 | 0.74 | 0.4 | 4 | 23.8 |
| 10 | 60 | 0.74 | 0.8 | 4 | 25.8 |

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for polishing gallium phosphide surfaces comprising mounting said gallium phosphide upon a surface polishing means providing a flow of an oxybromide solution selected from the group consisting of potassium oxybromide, sodium oxybromide, calcium oxybromide and lithium oxybromide onto the gallium phosphide while polishing said gallium phosphide, washing in situ and removing said gallium phosphide from polishing means.

2. A method in accordance with claim 1 wherein said oxybromide polishing solution is potassium oxybromide.

3. A method in accordance with claim 1 wherein said oxybromide polishing solution is sodium oxybromide.

4. A method in accordance with claim 1 wherein said oxybromide polishing solution is calcium oxybromide.

5. A method in accordance with claim 1 wherein said oxybromide polishing solution is lithium oxybromide.

6. A method for polishing gallium phosphide surfaces comprising mounting said gallium phosphide upon a surface polishing means providing a flow of an oxybromide solution selected from the group consisting of potassium oxybromide, sodium oxybromide, calcium oxybromide and lithium oxybromide, and an alkali metal solution onto the gallium phosphide while polishing the said gallium phosphide, washing in situ and removing said gallium phosphide from polishing means.

7. A method in accordance with claim 6 wherein said alkali metal solution is sodium carbonate.

8. A method in accordance with claim 6 wherein said alkali metal solution is sodium hydroxide.

* * * * *